(12) United States Patent
Kalliopuska et al.

(10) Patent No.: US 8,928,155 B2
(45) Date of Patent: Jan. 6, 2015

(54) DETECTOR STRUCTURE FOR IMAGING APPLICATIONS AND RELATED METHOD OF MANUFACTURE

(75) Inventors: Juha Kalliopuska, VTT (FI); Jan Jakubek, Prague (CZ)

(73) Assignee: Advacam Oy, Espoo (FI)

( * ) Notice: Subject to any disclaimer, the term of this patent is extended or adjusted under 35 U.S.C. 154(b) by 0 days.

(21) Appl. No.: 14/350,137

(22) PCT Filed: Sep. 14, 2012

(86) PCT No.: PCT/EP2012/068113
§ 371 (c)(1),
(2), (4) Date: Apr. 7, 2014

(87) PCT Pub. No.: WO2013/050229
PCT Pub. Date: Apr. 11, 2013

(65) Prior Publication Data
US 2014/0284752 A1    Sep. 25, 2014

(30) Foreign Application Priority Data
Oct. 6, 2011 (FI) ..................................... 20115982

(51) Int. Cl.
*H01L 25/00* (2006.01)
*H01L 27/146* (2006.01)
*H01L 25/04* (2014.01)

(52) U.S. Cl.
CPC ......... *H01L 27/14636* (2013.01); *H01L 25/045* (2013.01); *H01L 27/14661* (2013.01); *H01L 27/1467* (2013.01)
USPC ...................................................... 257/777

(58) Field of Classification Search
CPC ................... H01L 27/14636; H01L 27/1467; H01L 25/045
USPC ............................................ 257/686, 777, 774
See application file for complete search history.

(56) References Cited

U.S. PATENT DOCUMENTS

| 6,703,617 B1 | 3/2004 | Spartiotis et al. |
| 8,237,045 B2 * | 8/2012 | Nakata .......................... 136/250 |

(Continued)

FOREIGN PATENT DOCUMENTS

WO     2008/003351 A1    1/2008

OTHER PUBLICATIONS

International Search Report, dated Jan. 12, 2013, from corresponding PCT application.

(Continued)

*Primary Examiner* — Nathan Ha
(74) *Attorney, Agent, or Firm* — Young & Thompson (57) ABSTRACT

A hybrid pixel detector structure including a plurality of detector entities, each detector entity including at least one read-out element, such as a read-out ASIC, and an overlapping substantially edgeless radiation sensitive detector volume, these two being electrically coupled utilizing a number of conductive elements in between, further including a substrate, such as a circuit board, or multiple substrates such as one per detector entity, for accommodating the plurality of detector entities, wherein the substantially edgeless detector volume of at least one detector entity of the plurality includes an overhang portion outside the overlap between the detector volume and the read-out element, and the read-out element of at least one other detector entity of the plurality includes an extension portion, also outside the overlap, with a number of electrical coupling elements to electrically couple to the substrate, such as conductors and/or electronics thereof. A corresponding method of manufacture is presented.

11 Claims, 4 Drawing Sheets

(56) References Cited

U.S. PATENT DOCUMENTS

| | | | |
|---|---|---|---|
| 8,766,085 B2 * | 7/2014 | Tokioka et al. | 136/244 |
| 8,835,748 B2 * | 9/2014 | Frolov et al. | 136/249 |
| 8,866,281 B2 * | 10/2014 | Huang | 257/686 |
| 8,866,303 B2 * | 10/2014 | Kim | 257/774 |
| 2002/0006236 A1 | 1/2002 | Schulman | |
| 2003/0155516 A1 | 8/2003 | Spartiotis et al. | |
| 2004/0016913 A1 | 1/2004 | Sognefest et al. | |
| 2006/0185165 A1 | 8/2006 | Vafi et al. | |
| 2010/0255629 A1 | 10/2010 | Spartiotis et al. | |

OTHER PUBLICATIONS

FI Search Report, dated Jul. 6, 2012, from corresponding FI application.

* cited by examiner

PRIOR ART

DETECTOR STRUCTURE FOR IMAGING APPLICATIONS AND RELATED METHOD OF MANUFACTURE

FIELD OF THE INVENTION

Generally the present invention pertains to radiation detectors. In particular, the present invention concerns hybrid pixel detectors.

BACKGROUND

Generally, hybrid pixel detector entities comprising detector material and a bump-bonded read-out integrated circuit (ROIC or just ROC) may be utilized for almost a myriad of purposes in the field of radiation imaging and are capable of providing quality-wise superior images. Accordingly, the hybrid detectors have many advantageous features such as high dynamic range, low noise, energy-sensitivity, etc. in contrast to most common alternative, basically indirect, imaging technologies like flat-panel technology suffering from noise, poorer contrast, blurring and inadequate dynamic range, or e.g. scintillation screens supplemented with (CCD) cameras also having poorer contrast and other flaws.

Nevertheless, the applicability of hybrid pixel detectors is often limited by their relatively modest detection area size, which may typically be of the order of 10 square centimeters or less due to various technical challenges in the manufacturing of larger detectors resulting in a commercially unacceptable yield, for example.

As many use scenarios in the medical or scientific sector in general including human radiography, crystallography, non-destructive testing, security imaging and electron imaging still require or at least benefit from larger detection areas, so-called tiled configuration solutions incorporating a plurality of closely spaced detector chips forming an aggregate detector have been set forth and also exploited. However, the tile junctions, or "window frames", which may form e.g. about 10% of the overall combined, i.e. tiled, detector surface area appear in the final image unless extensive computer-based image processing is applied to remove those or the imaging gear and/or the imaging target are moved between several subsequent images used to eliminate the frame by constructing a single frameless image from the non-frame image portions of the taken several images. The resulting processed image is typically far from perfect and remains technically and/or financially unfeasible in many applications.

Figure 1:
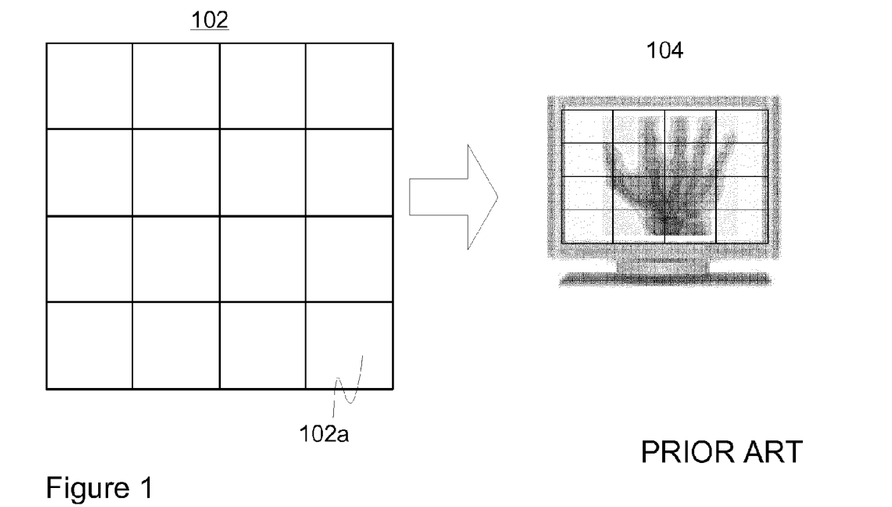
FIG. 1 illustrates the problems of contemporary large area detectors.

FIG. 1 illustrates by way of example only an array of rectangular detectors 102a arranged in a square configuration 102 to form a functionally larger area detector of 4×4 individual detectors. The annoying window frame effect and the associated loss of information arising from the physical separation of the tiles and thus active detection areas of the neighboring detectors is visible in the constructed image 104.

SUMMARY OF THE INVENTION

The objective is to at least alleviate the problem described hereinabove and to provide a hybrid detector solution feasible for use in applications requiring generally larger detection areas than a single hybrid detector is, in practical applications, capable of sensibly establishing.

The objective is achieved by different embodiments of a hybrid pixel detector structure in accordance with the present invention. In one aspect of the present invention, a hybrid pixel detector structure comprises a plurality of detector entities, each detector entity comprising a read-out element, such as ASIC or other read-out chip, and an overlapping substantially edgeless radiation sensitive detector volume, these two being electrically coupled via a number of conductive elements such as solder micro-bumps in between, at least one substrate, such as a printed circuit board (PCB), multiple PCBs or a low temperature co-fired ceramics (LTCC) substrate, for accommodating said plurality of detector entities, wherein the substantially edgeless detector volume of at least one detector entity of said plurality comprises an overhang portion outside the overlap between the detector volume and the read-out element thereof, and the read-out element of at least one other detector entity of said plurality comprises an extension portion, also outside the overlap, with a number of electrical coupling elements to electrically couple to the associated substrate, such as conductors and/or electronics thereof, further wherein said at least one detector entity and said at least one other detector entity are, as neighboring detector entities of the detector structure, being positioned to lie adjacent such that said overhang and extension portions thereof overlap and the edgeless detector volumes substantially meet each other preferably substantially in the same plane having no substantial angle or step between them, and finally wherein the electrical coupling elements, such as a number of printed wire connections, at most extend over the read-out element an amount in the order of magnitude of the conductive elements' height.

In one embodiment, the neighboring detector entities are parallel as to the detector volumes and radiation sensitive surfaces thereof. The entities may advantageously reside substantially in the same plane relative to the radiation receiving surfaces thereof after placement in the structure. The optional modest tilt angle between the radiation receiving surfaces, i.e. detection areas, of the detection volumes and a reference plane such as the overall effective detection plane of the detector structure, may reside within a range from about zero degrees to about 3 degrees, more preferably to about 2 degrees and most preferably to about 1 degree.

In one other, either supplementary or alternative, embodiment said number of electrical coupling elements include at least one coupling feature selected from the group consisting of: printed conductor, jet printed conductor, inkjet printed nanoparticle conductor, printed aerosol conductor, jet printed aerosol conductor, inkjet printed aerosol nanoparticle conductor, thin foil conductor, wirebond, bonding pad, bonding wire, conductive rod, cable such as micro-cable, and via such as TSV (through-silicon via) through the read-out element towards the substrate.

In a further, either supplementary or alternative, embodiment said at least one detector entity comprising the detector volume overhang at one end also comprises the extension portion at other end configured to co-operate with the overhang portion of a further detector entity of the detector structure to form an overlap region therewith.

Yet in a further, either supplementary or alternative, embodiment said at least one other detector entity comprising the extension portion of the read-out element at one end may correspondingly comprise the overhang portion at other end configured to overlap the extension portion of a read-out element of a further detector entity of the detector structure.

Still in a further, either supplementary or alternative, embodiment all the detector entities of said plurality have both extension and overhang portions at different, optionally opposite, ends thereof. Optionally, the detector entities of said plurality are mutually similar such as substantially identical. The similarity may extend to the used materials, dimensions, and/or functionalities, for instance.

In a further, either supplementary or alternative, embodiment the detector entities, or at least detector volumes and/or read-out elements thereof, are substantially planar.

In a further, either supplementary or alternative, embodiment the detector entities may comprise at least one silicon-based detector volume (sensitive material comprises or consists of silicon) and/or at least one compound-based such as CdTe-based or GaAs-based detector volume. Alternatively, other semiconductor materials or diamond may be utilized.

In a further, either supplementary or alternative, embodiment the detector structure further comprises a heat sink. The heat sink may be provided as a support to the substrate such as the aforementioned PCB. The heat sink may be provided as a support to the detector structure. The substrate may comprise structures such as holes for enabling e.g. air cooling of the above detectors. Likewise, detector entity carriers may comprise structures such as holes for facilitating enhanced cooling.

Edgeless detector volumes substantially comprising no passive, radiation insensitive (border) areas on the radiation receiving surface, being thus "edgeless", may be obtained through exploitation of any known edgeless detector technology such as the technology of VTT Technical Research Centre of Finland, for example.

In another aspect, a method for manufacturing a hybrid pixel detector structure comprises obtaining at least one substrate, such as a PCB, a plurality of PCBs or an LTCC, for accommodating a plurality of detector entities, obtaining said plurality of detector entities, each detector entity comprising a read-out element, such as ASIC or other read-out chip, and an overlapping substantially edgeless radiation sensitive detector volume, these two being electrically coupled via a number of conductive elements such as solder micro-bumps in between, wherein the substantially edgeless detector volume of at least one detector entity of said plurality comprises an overhang portion outside the overlap between the detector volume and the read-out element, and the read-out element of at least one other detector entity of said plurality comprises an extension portion, also outside the overlap, with a number of electrical coupling elements to electrically couple to the substrate associated with the read-out element, such as to the conductors and/or electronics thereof, and providing said plurality of detector entities on said at least one substrate, wherein said at least one detector entity and said at least one other detector entity are positioned to lie adjacent such that the overhang and extension portions thereof overlap and the edgeless detector volumes substantially meet each other, and wherein the electrical coupling elements, such as a number of printed wire connections, at most extend over the read-out element an amount in the order of magnitude of the conductive elements' height.

The utility of the present invention follows from a plurality of issues depending on each particular embodiment. The suggested solution facilitates forming large area detectors that substantially omit passive region gaps and related blind spots or include merely negligible insensitive regions between the detector tiles, whereupon the window frame effect is practically gone and complex compensation arrangements are unnecessary. The solution provides good efficiency, excellent dynamic range, practically immediate digitalization and thus fast readout. Yet, it is energy discriminating and enables direct energy measurement and single particle counting. The reachable pixel size is small (e.g. about 50×50 um), which turns into excellent spatial resolution. Despite of the various advantages, the manufacturing costs stay reasonable.

The obtained detectors may be utilized in various sectors of technology and science. For instance, when e.g. silicon is applied as radiation sensitive material, applications in the fields of low energy X-ray crystallography, material surface imaging (thanks to e.g. low energy electron diffraction), pharmaceutical 3D-protein imaging, non-destructive material inspection, high energy physics and space applications could be particularly mentioned not forgetting different security applications with e.g. neutron converter (monitoring, radiation identification and locating), or medical imaging. With e.g. CdTe is applied as radiation converting material, applications in the fields of high energy X-ray crystallography, transmission electron microscopy, non-destructive material inspection, high energy physics, security applications, medical imaging, and dosimetry could be particularly mentioned. When e.g. GaAs is utilized as radiation converting material, applications such as medical imaging applications, especially mammography, could be particularly mentioned. When diamond is utilized as radiation converting material, applications incorporating particle tracking in very hostile radiation environments become possible due to extreme radiation hardness of diamond.

The expression "a number of" refers herein to any positive integer starting from one (1), e.g. to one, two, or three.

The expression "a plurality of" refers herein to any positive integer starting from two (2), e.g. to two, three, or four.

The terms "a" and "an", as used herein, are defined as one or more than one.

The terms "conductive element" and "coupling element" may refer, as well as to a single-piece element, to a multi-part or multi-portion element having a plurality of parts or portions electrically connected and optionally also physically fixed together.

Different embodiments of the present invention are disclosed in the dependent claims.

BRIEF DESCRIPTION OF THE RELATED DRAWINGS

Next the invention is described in more detail with reference to the appended drawings in which.

DETAILED DESCRIPTION OF THE EMBODIMENTS

FIG. 1 was already reviewed in the background portion hereinbefore.

Figure 2:
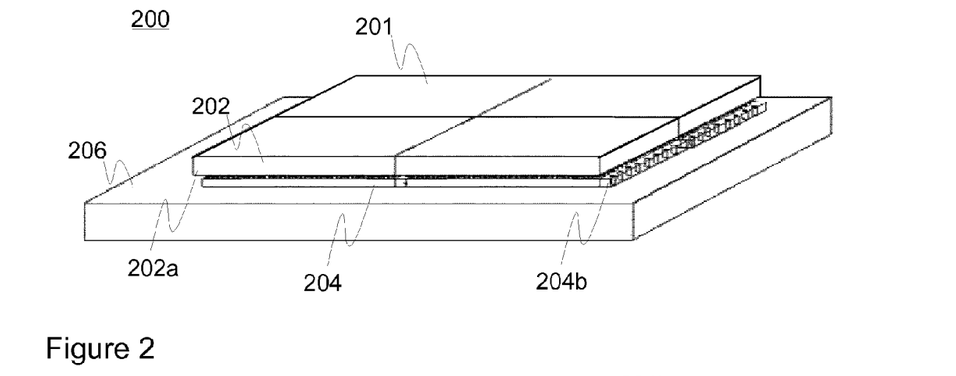
FIG. 2 illustrates one embodiment of the suggested detector structure.

FIG. 2 illustrates an embodiment of the direct imaging hybrid pixel detector structure 200 in accordance with the present invention. In the figure, four detector entities, e.g. detector modules, 201 having edgeless detectors volumes 202 with self-supporting overhang portions 202a are shown as located adjacent to each other. In practice, the number of detector entities 201 combined as suggested herein may be considerably larger. For instance, an array of a desired number of detector entities such as 4×4, 8×8, 13×13, or 16×16 detector element arrays could be created. One detector entity may have a radiation sensitive surface of e.g. 1.4×1.4 cm^2. The associated pixel size may be about 55 micrometers×55 micrometers, for instance. Each pixel may be connected to a read-out cell of the corresponding read-out element 204 that may process the charge signal by shaping and/or amplifying, count signals exceeding a discrimination threshold, etc.

The detector entities 201 may indeed define a rectangular, i.e. oblong or square, radiation sensitive surface and correspondingly incorporate a cuboidal detector volume 202, for example.

In the detector volume, detector material such as diamond, Si or other semiconductor material, potentially compound material, may be disposed between e.g. two electrodes. The detector entities 201 are preferably multi-side buttable and may bear e.g. two substantially vertical or generally straight side walls and other two more special ends, namely extension-including and overhang-including ends as described hereinbelow.

The alignment and orientation of the detector entities 201, or "tiles", may be mutually identical resulting in a regular array or matrix form, which in this embodiment facilitates forming a practically seamless larger area detector surface and volume by enabling bringing the individual detector entities as close to each other as possible. Advantageously, only very small radiation insensitive, i.e. passive, gaps (e.g. about 10 micrometers or considerably less in width), if any, may remain between the detector entities (and between the radiation sensitive surfaces thereof). Obviously such gaps form a negligible part of the overall detection (surface) area ideally responsive to the radiation.

The read-out elements 204 underlying the detector volumes 202 comprise the extension, or "peripheral", portions 204b that are electrically coupled to a number of predetermined locations/elements on the substrate 206 such as a PCB, a plurality of PCBs optionally connected together, or LTCC. The read-out element 204 and corresponding detector 202 may have been fixed together by direct or bump bonding such as micro-bump bonding using a solder e.g. indium. Flip chip bonding may be generally preferred as the signal paths between the sensor volume 202 and the read-out element 204 are kept short therewith. UBM (Under Bump Metallization) technology may be utilized. Direct bonding technologies such as metal-to-metal or oxide-to-oxide may be utilized. The read-out elements 204 and basically thus the associated detector entities as a whole may be secured to the substrate by gluing, screwing, taping and/or soldering, for example. The extension portions 204b may include e.g. control logic and/or I/O drivers for managing (ASIC) operation such as reading and detection data output, and are often beneficial if not absolutely necessary portions of the read-out elements.

In the embodiment of FIG. 2, the extension portions 204b of the read-out elements underlying the overlapping overhang portions 202a of the detector volumes 202 comprise TSVs as electrical coupling elements providing electrical connection to the substrate 206.

Figure 2B:
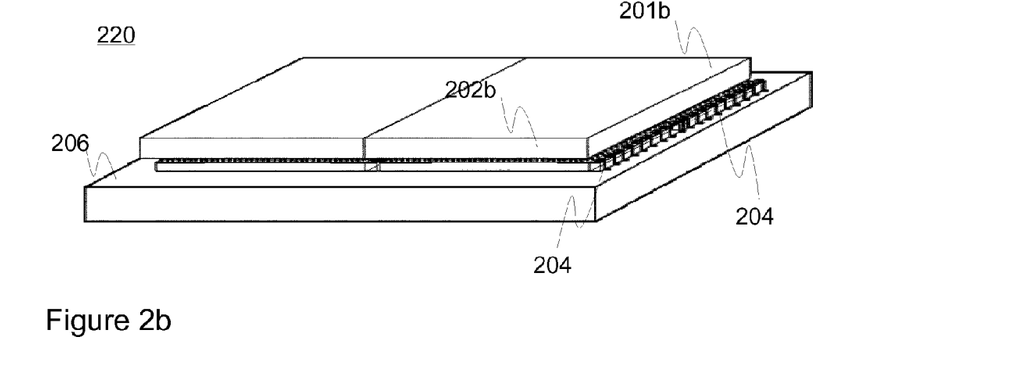
FIG. 2b illustrates a variation of the embodiment of FIG. 2 with potentially larger detector entities including multiple read-out elements.

In the embodiment shown in FIG. 2b, at least one detector entity 201b of the detector structure 220 includes multiple, in this example essentially two, read-out elements 204 connected to and serving a single, larger detector volume 202b.

Figure 3:
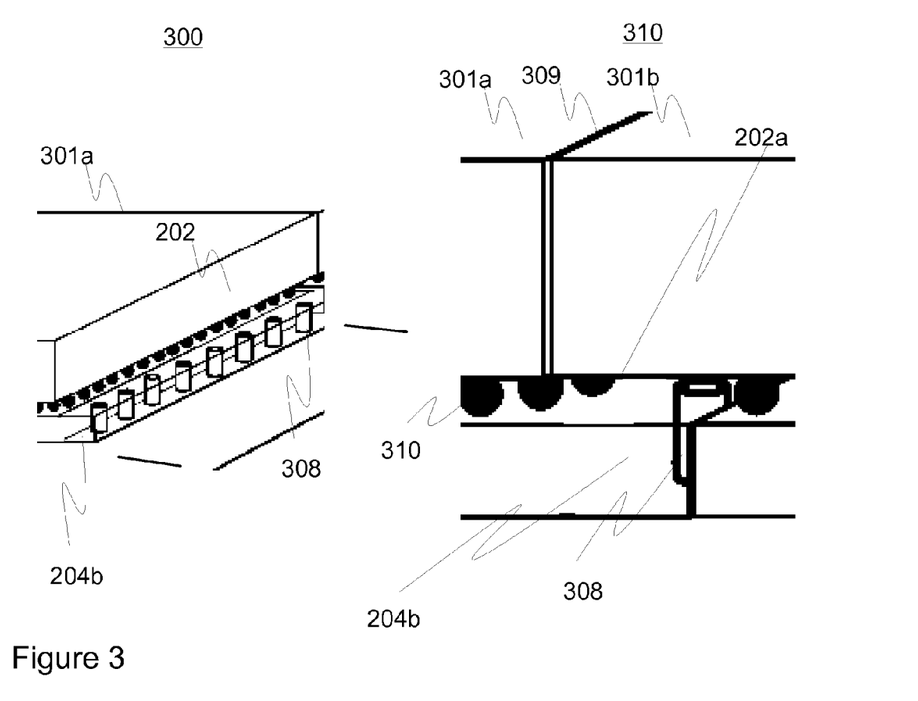
FIG. 3 provides a closer look at the peripheral portion of the detector structure of FIG. 2 with detector volume overhang and read-out element extension (peripheral portion) clearly shown.

FIG. 3 depicts the overlapping extension and overhang portions of the detector structure of FIG. 2 in more detail. In the magnification at 300, the extension portion 204b with TSVs 308, such as Cu TSVs, arranging the electrical coupling to the substrate is shown regarding detector entity 301a. The neighboring detector entity with the overhang overlapping the extension 204b has been omitted from this magnification for clarity purposes.

In the second magnification at 310 also the neighboring detector entity 301b with overhang portion 202a overlapping the extension portion 204b is present. As being easily understood on the basis of the figure, the edgeless detectors to be used in conjunction with the present invention comprise radiation sensitive volume also regarding the overhang area and the established larger area detector structure practically lacks the window frame effect-introducing passive regions caused by radiation insensitive gaps between the detectors 301a and 301b. The remaining gap 309, if any, is so narrow from the standpoint of imaging it does not require using extensive compensation methods such as moving target/detector between multiple shots or image data interpolation.

Figure 4:
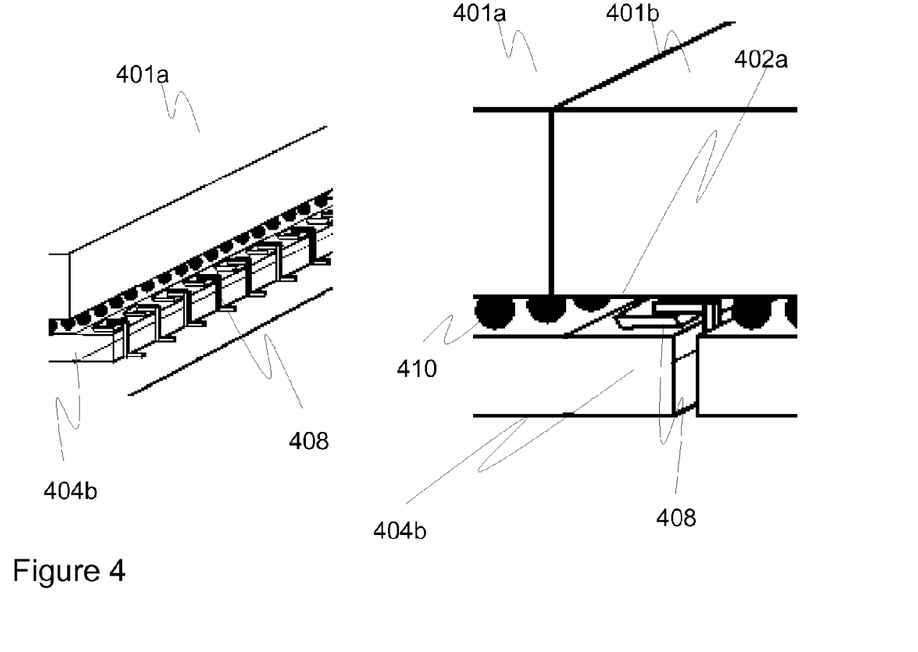
FIG. 4 correspondingly provides a closer look at the peripheral portion of one other embodiment.

FIG. 4 illustrates one other embodiment wherein, instead of TSV connections, the coupling elements include shallow printed conductor wire connections 408 obtained via inkjet printing or aerosol jetting, for example. The printed coupling elements may be configured to go over physical gaps and edges or steps, for instance. In the visualized embodiment, the coupling elements may be formed after tile placement on the substrate.

Preferably, the height of the coupling element portions on the extension portion 404b is in the order of magnitude of the micro-bump 410 height (or the height of corresponding conductive elements if no micro-bumps are used) between the detector and read-out element such that the coupling elements 408 substantially fit the available space as defined by the micro-bumps (which may typically mutually be of the same height) thus enabling providing a substantially even overall radiation sensitive detector surface without a need to substantially tilt the detector entities 401a and 401b to give the coupling elements more room.

Nevertheless, the (common) tilt of the detector entities 401a, 401b and optional further elements fixed thereto such as detector entity-specific substrates like PCBs, if used in connection with some embodiments to better accommodate the coupling elements between the adjacent tiles, is advantageously only about 1 degree or less relative to the reference plane such as the overall detection plane spanned by the detector structure. The reference plane may be defined as the plane extending through the centers of the radiation sensitive surfaces of the detector entities, for example. In the context of micro-sized electronics, one shall anyhow remember that e.g. PCB thickness fluctuation may be noticeable and slightly also affect the fit between the neighboring detector tiles and therefore some additional tolerance may be sensible to allow for the various gaps and angles of the structure, and the fit in overall.

Even more preferably, in the detector entity 401 a the height of the coupling element portions on the read-out element surface facing the overhang portion of the neighboring detector entity 401b maximally corresponds to the height of the micro-bumps or alternative conducting elements between the detector volume and the read-out element, and most preferably is less than that.

Figure 5:
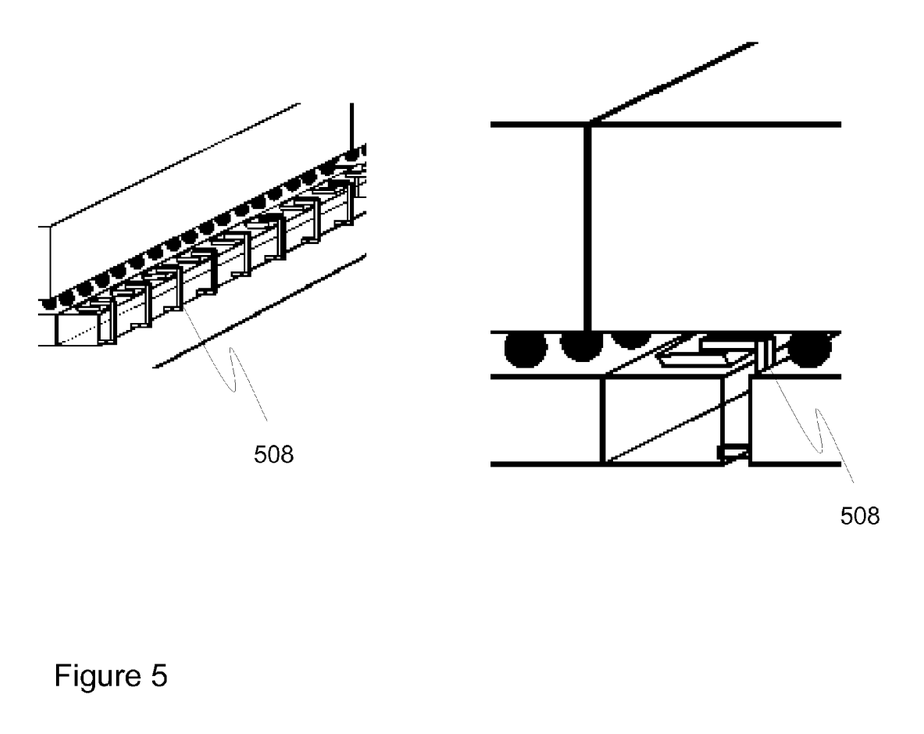
FIG. 5 provides a closer look at the peripheral portion of still one further embodiment.

In the embodiment of FIG. 5, the overall situation mostly corresponds to the one shown in FIG. 4. However, now the coupling elements 508 such as printed conductors have been formed as 'u-shapes' surrounding the edge of the extension portion of the read-out element 404b prior to placing the detector entity (tile) on the substrate. Depending on the desired manufacturing scenario, the more suitable method may be flexibly selected or even combined in the target application.

Regarding the above and other potential embodiments, the extension (periphery) width may naturally vary between the embodiments but could generally fall within range from about few tens of micrometers to several hundred micrometers, for example. In principle, the extension portion could be as narrow as 50 micrometers, or it could be e.g. 400 or 800 micrometers wide, or even wider. However, as the extension width affects the necessary hangover length of the matching detector volume of the neighboring detector entity, it should not be generally made unnecessarily long as a particularly long overhang portion may create additional challenges in terms of spatial resolution, pixel size and pixel intensity compensation (the overhang pixels may become substantially larger than the rest, which arises those challenges). Microbump height may typically fall within range from about 10-20 micrometers. Printed wire connections on the read-out element may typically be about 1-10 micrometers in height, for example. The detector volume thickness may be selected case-specifically to suit each use scenario. It may be as thin as about hundred micrometers or as thick as about 5 millimeters, or the thickness may reside somewhere between the extremes, for instance. The readout elements such as ASICs may be optionally thinned to e.g. about 100 micrometers, or alternatively, considerably thicker or thinner chips may be applied.

It is clear to a skilled person that the detector structure may comprise only a few or a larger number of additional functional and/or structural elements for providing beneficial communication, data storage, control, processing and/or other features, whereupon this disclosure is not to be construed as limiting the presence of the additional elements in the structure in any manner.

For example, at least one cooling element such as heat sink and/or a fan may be provided to the structure by fixing it to the substrate, for example. By efficient cooling it is ascertained that the detector structure in predetermined optimal operating temperature range and overheating is prevented. Metallization and via(s) may be applied for controlled heat transfer. Carriers of the detector entities may be provided with heat-funneling features such as thermal conductors and/or holes.

As another example, various electronics including conductors, components, chips, etc. may be provided directly onto the substrate and optionally into at least functional connection with the detector structure. The electronics may include processing apparatuses for processing instructions and/or other data such as a microprocessor, a microcontroller, a programmable logic chip, or a plurality of those. Yet, at least one memory chip may be provided for storing instructions and/or other data, being optionally integrated with the processing apparatus. Further, a data transfer entity such as a transmitter, a receiver and/or a transceiver may be arranged to enable data transfer between external entities and the detector structure for imaging data and/or control such as configuration data transfer. The provided data transfer capability may be wired or wireless.

Figure 6:
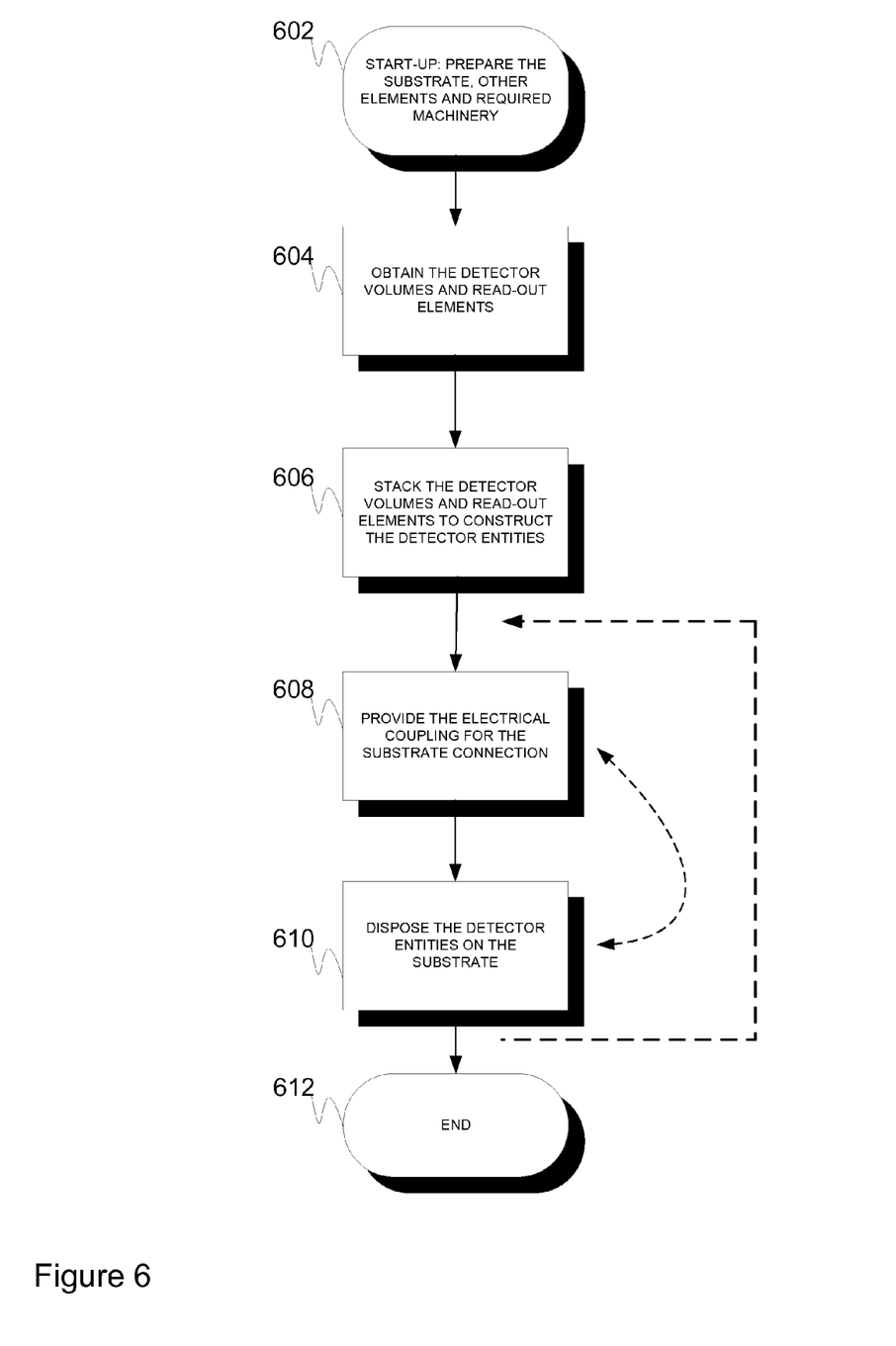
FIG. 6 is a flow chart disclosing an embodiment of a method in accordance with the present invention.

FIG. 6 discloses a merely exemplary method flow diagram in accordance with an embodiment of the present invention for manufacturing the suggested detector structure.

At 602, necessary materials and equipment such as a flip-chip bonder and various elements such as a common substrate (e.g. PCB) or multiple substrate elements (if e.g. each read-out chip and/or detector entity is at least initially allocated a dedicated one), supplementary electronics, and cooling elements may be obtained and prepared/configured.

At 604, the preferred kind of detector volumes (material, configuration, etc.) and read-out chips may be first determined and then obtained through component purchases and/or in-house manufacturing such that the overall requirement specification, which may be and often is application-specific, is fulfilled. The read-out chips may be manufactured using desired type CMOS technology, for instance. Various electrical coupling elements, such as TSVs or printed connections that penetrate the read-out chip may be manufactured at this stage. In addition, the UBM to enhance the connectivity to the substrate may be manufactured.

At 606, the detector entities (modules) may be constructed by stacking, or "sandwiching", the detector volumes and read-out elements by flip chip bonding and associated measures, for instance. A skilled person will understand that basically any suitable packaging technology may be applied. Connection from the read-out via wire connections to the substrate may be made with help of BGA (Ball Grid Array).

At items 608 and 610, the detector entities may be arranged to form the final detector structure. Now the entities shall be thus, at the latest, disposed on the associated predetermined substrate(s) such as a PCB or LTCC as explained hereinbefore, or be otherwise mutually located on a common carrier, for instance, so that the extension and overhang portions of adjacent detector entities overlap providing a practically seamless overall detection surface, and the electrical coupling to the substrate electronics is arranged, finalized or retained depending on the embodiment.

The execution of items 608 and 610 may be repeated and/or the execution order flexibly changed, which is indicated in the figure by the dotted loopback and bi-directional arrows, as the detector entities may be mounted in groups or one at a time so that the necessary electrical coupling may be cleverly done in between, when necessary, depending on e.g. the selected coupling element construction of the particular embodiment in question. Also, one or more selected actions of items 604 and/or 606 may be combined or mixed with the execution of items 608 and/or 610 (or vice versa) by a skilled person depending e.g. on the requirements of the particular manufacturing scenario in question. As a further remark, connection from the read-out chip via wire connections to the substrate may be made with the help of e.g. predesigned Ball Grid Array (BGA).

Method execution is ended at 612. The mutual ordering and overall presence of the method steps, as already deliberated above, may be altered by a skilled person based on the requirements set by each particular use scenario. New process steps may be added and the existing ones merged or deleted, when seen appropriate.

Consequently, a skilled person may on the basis of this disclosure and general knowledge apply the provided teachings in order to implement the scope of the present invention as defined by the appended claims in each particular use case with necessary modifications, deletions, and additions. In some solutions, in addition to or instead of the extension portion, the cell portion of the read-out element may include vias such as TSVs for electrically connecting to the underlying substrate.

Further, in some solutions a detector entity may comprise a plurality of read-out elements such that a larger detector volume (detector material element) is supplemented by a plurality of smaller area-serving read-out elements such as ASICs or other chips. Preferably in that case the periphery (extension) portions of the read-out elements may be provided with necessary coupling elements for substrate connections prior to the overlapping detector volume provision. Yet, the extension portions of the read-out element(s) of a detector entity may be connected to the substrate before disposing the neighboring detector entity comprising a plurality of read-out elements of its own, for instance.

Further, each detector entity, having periphery (extension) portions of the read-out element(s) to be provided with necessary coupling elements for substrate connections, may, in some embodiments, be at least initially connected to a separate substrate optionally covering e.g. the area below the read-out element(s). Then, these detector entities accompanied with at least initially dedicated substrates may be disposed similarly as has been described hereinbefore to establish the common detector structure, wherein the initially separate substrates may be optionally joined together and/or disposed on a common further carrier element (common substrate), for instance. Initial substrates may optionally be read-out element and/or detector entity/volume-specific.

The invention claimed is:

1. A hybrid pixel detector structure comprising
a plurality of detector entities, each detector entity comprising a read-out element and an overlapping substantially edgeless radiation sensitive detector volume, these two being electrically coupled utilizing a number of conductive elements, optionally solder micro-bumps, in between,
at least one substrate, such as a circuit board or a plurality of those, for accommodating said plurality of detector entities,
wherein the substantially edgeless detector volume of at least one detector entity of said plurality comprises an overhang portion outside the overlap between the detector volume and the read-out element, and the read-out element of at least one other detector entity of said plurality comprises an extension portion, also outside the overlap, with a number of electrical coupling elements to electrically couple to the associated substrate, such as conductors and/or electronics thereof,
further wherein said at least one detector entity and said at least one other detector entity are, as neighboring detector entities of the detector structure, being positioned to lie adjacent such that said overhang and extension portions thereof overlap and the edgeless detector volumes substantially meet each other, preferably substantially in the same plane having no substantial angle or step between them,
and finally wherein the electrical coupling elements, such as a number of printed wire connections, at most extend over the read-out element an amount in the order of magnitude of the conductive elements' height.

2. The detector structure of claim 1, wherein said read-out element comprises an ASIC (application-specific integrated circuit).

3. The detector structure of claim 1, wherein the read-out element and detector volume of each detector entity have been flip chip bonded together.

4. The detector structure of claim 1, wherein said number of electrical coupling elements include at least one coupling feature selected from the group consisting of: printed conductor, jet printed conductor, inkjet printed nanoparticle conductor, printed aerosol conductor, jet printed aerosol conductor, inkjet printed aerosol nanoparticle conductor, thin foil conductor, wirebond, bonding pad, bonding wire, conductive rod, cable, micro-cable, via, and TSV (through-silicon via).

5. The detector structure of claim 1, wherein each detector entity of the structure comprises the overhang and extension portions in the detector volume and read-out element, respectively.

6. The detector structure of claim 1, wherein said detector volume comprises semiconductor material, preferably silicon.

7. The detector structure of claim 1, wherein said detector volume comprises insulator material, preferably diamond.

8. The detector structure of claim 1, wherein said detector volume comprises semiconductor compound material, preferably CdTe, CdZnTe or GaAs.

9. The detector structure of claim 1, comprising a heat absorbing and/or funneling element such as a heat sink.

10. The detector structure of claim 1, wherein the substrate and optionally at least one carrier of a detector entity comprise a cavity, a through-hole and/or a slot configured to facilitate heat transfer away from the detector structure.

11. A method for manufacturing a hybrid pixel detector structure comprising
obtaining at least one substrate, such as a circuit board or a plurality of those, for accommodating a plurality of detector entities,
obtaining said plurality of detector entities, each detector entity comprising a read-out element, such as ASIC or other read-out chip, and an overlapping substantially edgeless radiation sensitive detector volume, these two being electrically coupled via a number of conductive elements such as solder micro-bumps in between, wherein the substantially edgeless detector volume of at least one detector entity of said plurality comprises an overhang portion outside the overlap between the detector volume and the read-out element, and the read-out element of at least one other detector entity of said plurality comprises an extension portion, also outside the overlap, with a number of electrical coupling elements to electrically couple to the associated substrate, such as to the conductors and/or electronics thereof, and
providing said plurality of detector entities on said at least one substrate, wherein said at least one detector entity and said at least one other detector entity are positioned to lie adjacent such that the overhang and extension portions thereof overlap and the edgeless detector volumes substantially meet each other, and wherein the electrical coupling elements, such as a number of printed wire connections, at most extend over the read-out element an amount in the order of magnitude of the conductive elements' height.

* * * * *